United States Patent
Mahorowala et al.

(10) Patent No.: US 10,074,543 B2
(45) Date of Patent: Sep. 11, 2018

(54) HIGH DRY ETCH RATE MATERIALS FOR SEMICONDUCTOR PATTERNING APPLICATIONS

(71) Applicant: Lam Research Corporation, Fremont, CA (US)

(72) Inventors: Arpan Mahorowala, West Linn, OR (US); Ishtak Karim, Portland, OR (US); Purushottam Kumar, Hillsboro, OR (US); Shankar Swaminathan, Beaverton, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/253,546

(22) Filed: Aug. 31, 2016

(65) Prior Publication Data
US 2018/0061650 A1 Mar. 1, 2018

(51) Int. Cl.
*H01L 21/311* (2006.01)
*H01L 21/3065* (2006.01)
*H01L 21/308* (2006.01)
*H01L 27/108* (2006.01)

(52) U.S. Cl.
CPC ...... *H01L 21/3065* (2013.01); *H01L 21/3081* (2013.01); *H01L 21/31144* (2013.01); *H01L 27/10844* (2013.01)

(58) Field of Classification Search
CPC ............. H01L 21/3065; H01L 21/3081; H01L 21/31144; H01L 27/10844
See application file for complete search history.

(56) References Cited

U.S. PATENT DOCUMENTS

| 4,158,717 A | 6/1979 | Nelson |
| 4,500,563 A | 2/1985 | Ellenberger et al. |
| 4,575,921 A | 3/1986 | Bhagat |

(Continued)

FOREIGN PATENT DOCUMENTS

| CN | 1732288 A | 2/2006 |
| CN | 1841676 A | 10/2006 |

(Continued)

OTHER PUBLICATIONS

U.S. Appl. No. 14/552,011, filed Nov. 24, 2014, entitled "Selective Inhibition in Atomic Layer Deposition of Silicon-Containing Films."

(Continued)

*Primary Examiner* — Stephen W Smoot
*Assistant Examiner* — Vicki B Booker
(74) *Attorney, Agent, or Firm* — Weaver Austin Villeneuve & Sampson LLP

(57) ABSTRACT

Methods and apparatuses for depositing low density spacers using atomic layer deposition for negative patterning schemes are provided herein. Methods involve one or more of: (1) exposing a substrate to a plasma for a duration less than about 300 ms in each cycle of alternating pulses of a deposition precursor and oxidizing plasma; (2) exposing the substrate to the plasma at a radio frequency power density of less than about 0.2 W/cm$^2$; and (3) exposing the substrate to the plasma produced from a process gas having an argon to oxidant ratio of at least about 1:12.

26 Claims, 9 Drawing Sheets

(56) References Cited

U.S. PATENT DOCUMENTS

| | | |
|---|---|---|
| 4,869,781 A | 9/1989 | Euen et al. |
| 5,091,332 A | 2/1992 | Bohr et al. |
| 5,230,929 A | 7/1993 | Caporiccio et al. |
| 5,314,724 A | 5/1994 | Tsukune et al. |
| 5,459,099 A | 10/1995 | Hsu |
| 5,496,608 A | 3/1996 | Matsuda et al. |
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,713,592 B2 | 5/2010 | Nguyen et al. |
| 7,732,343 B2 | 6/2010 | Niroomand et al. |
| 7,758,920 B2 | 7/2010 | Hasebe et al. |
| 7,807,578 B2 | 10/2010 | Bencher et al. |
| 7,825,039 B2 | 11/2010 | Takahashi et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,105,901 B2 | 1/2012 | Cheng et al. |
| 8,119,544 B2 | 2/2012 | Hasebe et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,592,328 B2 | 11/2013 | Hausmann et al. |
| 8,623,770 B1 | 1/2014 | Gao et al. |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,846,484 B2 | 9/2014 | Lee et al. |
| 8,936,977 B2 | 1/2015 | Hoentschel et al. |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,355,839 B2 | 5/2016 | Swaminathan et al. |
| 9,390,909 B2 | 7/2016 | Pasquale et al. |
| 9,443,731 B1 | 9/2016 | O'Meara et al. |
| 9,472,506 B2 | 10/2016 | Conklin et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,670,579 B2 | 6/2017 | Hausmann et al. |
| 9,721,784 B2 | 8/2017 | Behera et al. |
| 9,865,815 B2 | 1/2018 | Hausmann et al. |
| 9,875,891 B2 | 1/2018 | Henri et al. |
| 9,892,933 B2 | 2/2018 | Peng et al. |
| 2002/0001889 A1 | 1/2002 | Kim et al. |
| 2002/0001929 A1 | 1/2002 | Biberger et al. |
| 2003/0143841 A1 | 7/2003 | Yang et al. |
| 2004/0043570 A1 | 3/2004 | Fujisaki et al. |
| 2005/0025885 A1 | 2/2005 | McSwiney et al. |
| 2005/0042865 A1 | 2/2005 | Cabral et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |
| 2006/0008656 A1 | 1/2006 | Veerasamy |
| 2006/0084283 A1 | 4/2006 | Paranjpe et al. |
| 2006/0088985 A1 | 4/2006 | Haverkort et al. |
| 2006/0199357 A1 | 9/2006 | Wan et al. |
| 2006/0286776 A1 | 12/2006 | Ranish et al. |
| 2007/0137572 A1 | 6/2007 | Matsuura et al. |
| 2007/0167028 A1 | 7/2007 | Chou et al. |
| 2007/0218661 A1 | 9/2007 | Shroff et al. |
| 2007/0251444 A1 | 11/2007 | Gros et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0148625 A1 | 6/2009 | Yeom et al. |
| 2009/0155606 A1 | 6/2009 | Yoon et al. |

(56) References Cited

U.S. PATENT DOCUMENTS

| | | |
|---|---|---|
| 2009/0163041 A1 | 6/2009 | Mungekar et al. |
| 2009/0191722 A1 | 7/2009 | Hasebe et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0304047 A1* | 12/2010 | Yang ............... C23C 16/308 427/577 |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0176967 A1 | 7/2011 | Okuda et al. |
| 2011/0183528 A1 | 7/2011 | Wang et al. |
| 2011/0244142 A1 | 10/2011 | Cheng et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1* | 2/2012 | Onizawa ............ C23C 16/345 438/694 |
| 2012/0058282 A1 | 3/2012 | Hong et al. |
| 2012/0104347 A1 | 5/2012 | Quick |
| 2012/0108079 A1 | 5/2012 | Mahajani |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0084688 A1 | 4/2013 | O'Meara et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0210236 A1* | 8/2013 | Ogihara ............ C07F 7/1836 438/706 |
| 2013/0252437 A1 | 9/2013 | Sano et al. |
| 2013/0344248 A1 | 12/2013 | Clark |
| 2014/0023794 A1 | 1/2014 | Mahajani et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0137061 A1 | 5/2015 | Donghi et al. |
| 2015/0200110 A1 | 7/2015 | Li et al. |
| 2015/0243708 A1 | 8/2015 | Ravasio et al. |
| 2015/0259791 A1 | 9/2015 | Hausmann et al. |
| 2016/0020092 A1 | 1/2016 | Kang et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1 | 4/2016 | Yan et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0172194 A1 | 6/2016 | Kunnen et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0336178 A1 | 11/2016 | Swaminathan et al. |
| 2016/0336187 A1 | 11/2016 | Liou et al. |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092857 A1 | 3/2017 | Hausmann et al. |
| 2017/0117134 A1 | 4/2017 | Henri et al. |
| 2017/0148637 A1* | 5/2017 | deVilliers ........... H01L 21/0337 |
| 2017/0170015 A1 | 6/2017 | Kim et al. |
| 2017/0323785 A1 | 11/2017 | Singhal et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 103225071 A | 7/2013 |
| EP | 0 277 766 | 8/1988 |
| EP | 2 278 046 A1 | 1/2011 |
| GB | 1 181 559 | 2/1970 |
| JP | 2005-210076 A | 8/2005 |
| JP | 2006-060091 | 3/2006 |
| JP | 2007-281181 A | 10/2007 |
| JP | 2008-517479 | 5/2008 |
| JP | 2010-10497 | 1/2010 |
| JP | 2010-283388 A | 12/2010 |
| JP | 2013225655 A | 10/2013 |
| JP | 2014-532304 A | 12/2014 |
| KR | 10-2009-0080019 | 7/2009 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |

OTHER PUBLICATIONS

U.S. Appl. No. 14/935,317, filed Nov. 6, 2015, entitled "Method for Encapsulating a Chalcogenide Material."

U.S. Appl. No. 15/272,222, filed Sep. 21, 2016, entitled "Bromine Containing Silicon Precursors for Encapsulation Layers."

U.S. Appl. No. 15/201,221, filed Jul. 1, 2016, entitled "Selective Atomic Layer Deposition With Post-Dose Treatment."

U.S. Appl. No. 15/253,301, filed Aug. 31, 2016, entitled "Selective Atomic Layer Deposition for Gapfill Using Sacrificial Underlayer."

U.S. Appl. No. 15/279,314, filed Sep. 28, 2016, entitled "Method to Deposit Conformal and Low Wet Etch Rate Encapsulation Layer Using PECVD."

U.S. Appl. No. 15/279,312, filed Sep. 28, 2016, entitled "Doped ALD Films for Semiconductor Patterning Applications."

U.S. Appl. No. 15/258,789, filed Sep. 7, 2016, entitled "Nitride Film Formed by Plasma-Enhanced and Thermal Atomic Layer Deposition Process."

(56) References Cited

OTHER PUBLICATIONS

U.S. Appl. No. 15/351,221, filed Nov. 14, 2016, entitled "Method for High Modulus ALD SIO2 Spacer."
U.S. Appl. No. 15/349,753, filed Nov. 11, 2016, entitled "Method for Reducing the Wet Etch Rate of a SIN Film Without Damaging the Underlying Substrate."
U.S. Notice of Allowance dated Aug. 18, 2015 issued in U.S. Appl. No. 14/494,914.
U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
Chinese First Office Action dated May 19, 2016 issued in CN 201310021460.8.
European Extended Search Report dated Apr. 14, 2014 issued in EP 13 152 046.2.
Korean Notice of Provisional Rejection dated Dec. 6, 2013 issued in KR 10-20120043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.
Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.

King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Lin et al., (1998) "Silicon Nitride Films Deposited by Atmospheric Pressure Chemical Vapor Deposition," *Materials Research Society Symposium Proceedings* vol. 495, *Chemical Aspects of Electronic Ceramics Processing*, Symposium held Nov. 30-Dec. 4, 1997, Boston, Massachusetts, U.S.A., 8 pages.
Plasma Enhanced Atomic Layer Deposition (PEALD), Website: http://www.asm.com/index.php?option=com_content&task=view&id=19&Itemid=161 (2010), 1 page.
"PlasmaPro™ NGP®80 Range," *Oxford Instruments* (2010), 8 pages.
U.S. Notice of Allowance dated Sep. 28, 2017 issued in U.S. Appl. No. 15/399,637.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Apr. 7, 2017 issued in U.S. Appl. No. 15/279,314.
U.S. Final Office Action dated Oct. 19, 2017 issued in U.S. Appl. No. 15/279,314.
U.S. Notice of Allowance dated Feb. 8, 2017 issued in U.S. Appl. No. 14/713,639.
Chinese First Office Action dated Nov. 8, 2017 issued in Application No. CN 201510615853.0.
Chinese Second Office Action dated Apr. 13, 2017 issued in Application No. CN 201310021460.8.
Chinese Third Office Action dated Oct. 17, 2017 issued in Application No. CN 201310021460.8.
European Examination Report dated Dec. 11, 2017 issued in Application No. EP 13 15 2046.
Japanese Office Action dated Jan. 10, 2017 issued in Application No. JP 2013007612.
Taiwan Examination Report dated Mar. 29, 2017 issued in Application No. TW 102102054.
PCT International Search Report and Written Opinion dated Feb. 13, 2018 issued in Application No. PCT/US2017/060692.
PCT International Search Report and Written Opinion dated Feb. 21, 2018 issued in Application No. PCT/US2017/060240.
Huang et al. (2017) "Design of efficient mono-aminosilane precursors for atomic layer deposition of $SiO_2$ thin films," *Royal Society of Chemistry Adv.* 2017, 7:22672-22678.
Kunnen et al., (2015) "A way to integrate multiple block layers for middle of line contact patterning," *Proc. of SPIE*, 9428:94280W1-8 [Downloaded on Jun. 27, 2017 from http://proceedings.spiedigitallibrary.org].
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
U.S. Appl. No. 15/349,746, filed Nov. 11, 2016, LaVoie.
U.S. Appl. No. 15/703,917, filed Sep. 13, 2017, Abel et al.
U.S. Appl. No. 15/829,702, filed Dec. 1, 2017, Hausmann.
U.S. Appl. No. 15/847,744, filed Dec. 19, 2017, Henri et al.
Preliminary Amendment dated Feb. 1, 2018 in U.S. Appl. No. 15/829,702.
Preliminary Amendment dated Feb. 1, 2018 in U.S. Appl. No. 15/847,744.
U.S. Final Office Action dated Jan. 18, 2018 issued in U.S. Appl. No. 15/349,746.
U.S. Office Action dated Jul. 14, 2017 issued in U.S. Appl. No. 15/349,746.
U.S. Office Action dated Jul. 5, 2017 issued in U.S. Appl. No. 15/351,221.
U.S. Office Action dated Jun. 29, 2017 issued in U.S. Appl. No. 15/279,312.
U.S. Final Office Action dated Jan. 2, 2018 issued in U.S. Appl. No. 15/351,221.
U.S. Office Action dated Oct. 23, 2017 issued in U.S. Appl. No. 15/349,753.

(56) References Cited

OTHER PUBLICATIONS

U.S. Final Office Action dated Apr. 9, 2018 issued in U.S. Appl. No. 15/279,312.
Chinese First Office Action dated Mar. 30, 2018 issued in Application No. CN 201610206201.6.
U.S. Final Office Action dated Apr. 20, 2018 issued in U.S. Appl. No. 15/349,753.

* cited by examiner

HIGH DRY ETCH RATE MATERIALS FOR SEMICONDUCTOR PATTERNING APPLICATIONS

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique.

SUMMARY

Provided herein are methods and apparatuses for processing substrates. One aspect involves a method of patterning a substrate using negative patterning, the method including: depositing a spacer conformally over a core material, the spacer deposited by one or more atomic layer deposition cycles, each atomic layer deposition cycle including: exposing the substrate to a deposition precursor, and exposing the substrate to an oxidant and igniting a plasma; and forming a mask for patterning a substrate by selectively etching the spacer under conditions for etching the spacer at a rate at least six times faster than that of the core material.

In various embodiments, the core material includes carbon. In some embodiments, the core material may be a photoresist, amorphous carbon, or amorphous silicon. In some embodiments, the core material is any one of spin on carbon, diamond-like carbon, and gapfill ashable hard mask.

Depositing the spacer may include using one or more of the following techniques: (1) exposing the substrate to the plasma for a duration less than about 300 ms in each cycle; (2) exposing the substrate to the plasma at a radio frequency power density of less than about 0.2 W/cm² of substrate active surface area; and (3) exposing the substrate to the plasma produced from a process gas having an argon to oxidant ratio of at least about 1:12.

In some embodiments, the spacer includes a silicon-containing material. For example, in some embodiments, the spacer includes silicon oxide.

The spacer may have a refractive index between about 1.4 and about 1.5. The spacer may be deposited to a thickness between about 10 nm and about 30 nm. Selectively etching the spacer may include exposing the substrate to a fluorocarbon etchant. In various embodiments, the spacer is deposited at a temperature between about 50° C. and about 200° C. The spacer may have a dielectric constant of between about 4 and 6.

In some embodiments, the technique selected is (3), and the oxidant is flowed at a flow rate between about 0.5 slm and about 3 slm.

In some embodiments, after depositing the spacer conformally over the core material, a gap fill material is deposited over the substrate. The gap fill material may be any of amorphous carbon, spin-on carbon, diamond-like carbon, gap-fill ashable hardmask, titanium oxide, hafnium oxide, zirconium oxide, or amorphous silicon. Selectively etching the spacer may include etching the spacer under conditions whereby the etch rate of the spacer is at least six times faster than that of the gap fill material.

The method may also include etching the substrate using the mask during fabrication of a DRAM.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: deposit a spacer conformally over a core material on a substrate housed in one of the one or more process chambers, the spacer deposited by one or more atomic layer deposition cycles, each atomic layer deposition cycle including: flowing a deposition precursor, and flowing an oxidant and igniting a plasma; and selectively etching the spacer relative to the core material under conditions for etching the spacer at a rate at least six times faster than that of the core material.

The instructions for depositing the spacer may include instructions for igniting the plasma for a duration less than about 300 ms in each cycle. The instructions for depositing the spacer may include instructions for igniting the plasma at a radio frequency power density of less than about 0.2 W/cm² of substrate active surface area. The instructions for depositing the spacer may include instructions for flowing argon and the oxidant to the one of the one or more process chambers at a ratio of at least about 1:12 when the oxidant is flowed and the plasma is ignited.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning methods are used in many semiconductor manufacturing processes. In particular, multiple patterning has been used to extend lithographic technology beyond its optical limits. Double patterning is one example technology used to extend lithographic technology beyond its optical limits and is now widely used in the industry for pitches less than about 80 nm. Current double patterning technologies often use sidewall spacers with two masking steps to pattern trenches. Methods of double patterning, particularly line patterning, in both positive and negative double patterning processes have involved the use of spacers and masks. However, current methods result in poor, unstable, and weak masks that are unable to provide effective formation of high aspect ratio features in semiconductor devices. Methods that reduce process operations are also preferred for increased efficiency and throughput.

Figure 1A:
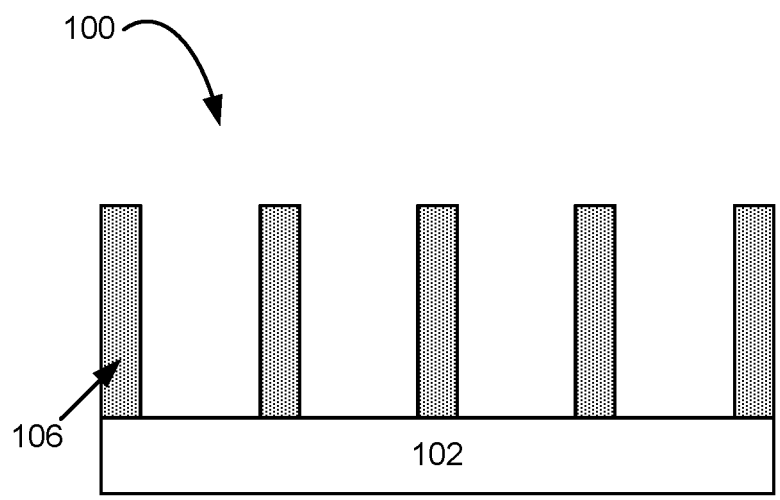
FIGS. 1A-1E are schematic illustrations of a substrate subject to a negative self-aligned double patterning scheme.
Figure 1B:
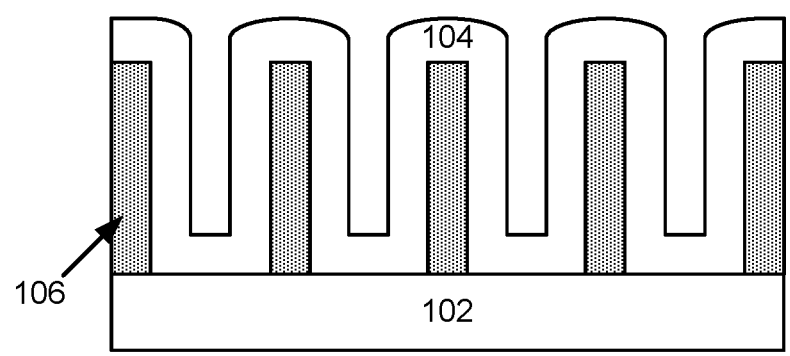
Figure 1C:
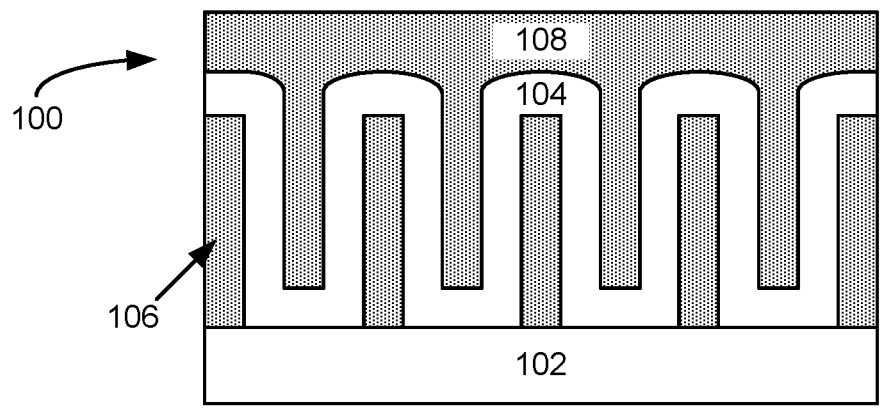
Figure 1D:
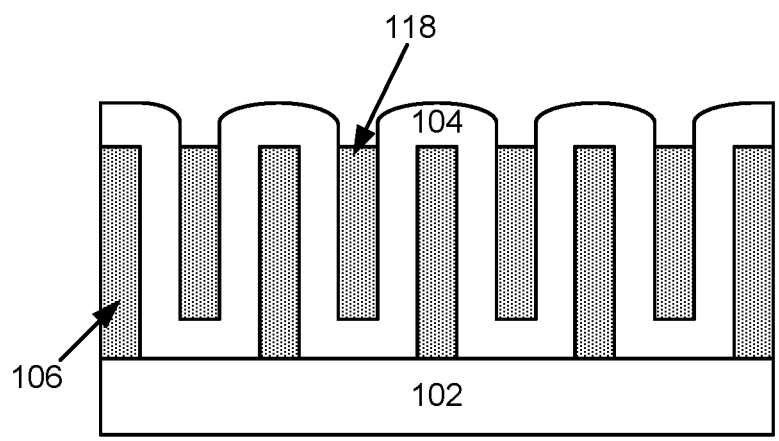
Figure 1E:
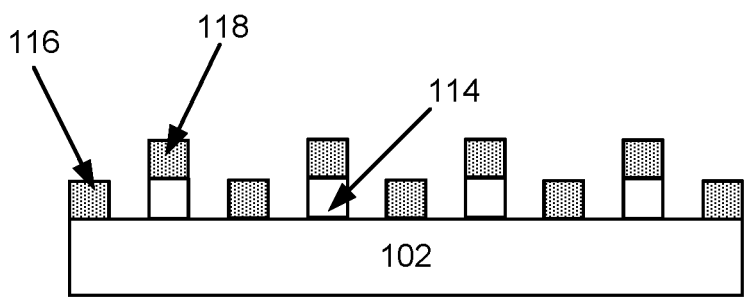
Figure 2:
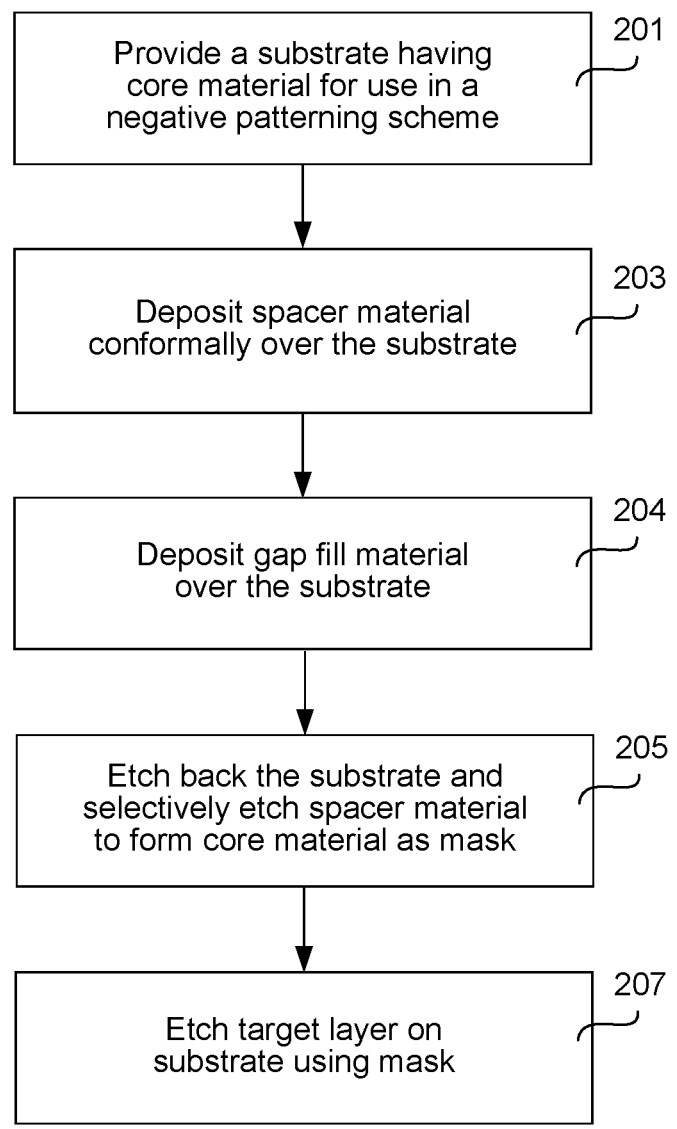
FIGS. 2 and 3 are process flow diagrams depicting operations for methods in accordance with certain disclosed embodiments.

An example is provided in FIGS. 1A through 1E, which are schematic illustrations of a substrate undergoing a negative patterning scheme where the spacer is deposited using conventional deposition techniques. FIG. 2 provides a process flow diagram depicting operations for performing a negative patterning scheme. For purposes of illustration, FIGS. 1A through 1E and FIG. 2 are discussed together.

In operation 201 of FIG. 2, a substrate having core material for use in a negative patterning scheme is provided. FIG. 1A shows a substrate 100 including a target layer 102 and a patterned core material 106. In various embodiments, the substrate 100 is a semiconductor substrate. The substrate 100 may be a silicon wafer, e.g., a 200-mm wafer, a 300-mm wafer, or a 450-mm wafer, including wafers having one or more layers of material, such as dielectric, conducting, or semi-conducting material deposited thereon.

The target layer 102 may be the layer ultimately to be patterned. The target layer 102 may be a semiconductor, dielectric, or other layer and may be made of silicon (Si), silicon oxide ($SiO_2$), silicon nitride (SiN), or titanium nitride (TiN), for example. The target layer 102 may be deposited by atomic layer deposition (ALD), plasma-enhanced ALD (PEALD), chemical vapor deposition (CVD), or other suitable deposition technique.

The core material 106 may be a photoresist or may be made of amorphous carbon material or amorphous silicon material. In some embodiments, the core material 106 may be transparent. The core material 106 is deposited by a deposition technique, such as plasma enhanced chemical vapor deposition (PECVD), and the deposition technique may involve generating a plasma in the deposition chamber from deposition gases including a hydrocarbon precursor. The hydrocarbon precursor may be defined by the formula $C_aH_b$, where a is an integer between 2 and 10, and b is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. The core material 106 is deposited over a target layer 102 prior to being patterned.

Referring to FIG. 2, in operation 203, a spacer material is deposited conformally over the substrate. FIG. 1B shows a conventional spacer material 104 deposited conformally over the core material 106. Conventional techniques for depositing spacer material include ALD and PEALD using silicon- or germanium-containing precursors and an oxidizing plasma to form silicon oxide or germanium oxide, respectively.

ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of the precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second reactant reacts immediately with the adsorbed first precursor. In other embodiments, the second reactant reacts only after a source of activation such as plasma is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

However, conventional techniques for depositing spacer material over a substrate may not achieve the etch selectivity sufficient to form high quality masks, as further described below. Referring to FIG. 2, in operation 204, a gap fill material is deposited over the substrate. In some embodiments, the gap fill material may be a carbon-containing material, which may be deposited by methods including PECVD and spin-on techniques. In various embodiments, the gap fill material may be a metal oxide, such as titanium oxide, hafnium oxide, and zirconium oxide. In some embodiments, the gap fill material may be amorphous silicon. FIG. 1C shows an example substrate 100 having gap fill material 108 deposited over the substrate 100. Gap fill material may be gap-fill ashable hard mask in some embodiments.

Referring to FIG. 2, in operation 205, the substrate is etched back and the spacer material is selectively etched to form core material as a double patterning mask. FIG. 1D shows the gap fill material 118 being etched back. When conventionally deposited spacer material is selectively etched, as shown in FIG. 1E, the spacer material is removed, but because of the poor etch selectivity, the core material 116 becomes degraded and reduced in height. Remaining gap-fill material 118 over etched spacer material 114 remains on the substrate, but the mask includes a pattern substantially shorter than desired. Having a short mask can result in poor etching of the target layer 102, which results in reliability issues and device problems.

Problems associated with these conventional techniques may be due to the type of spacer material deposited conformally over the substrate prior to forming gap fill carbon-containing material over the substrate. Thus, it is desired to fabricate a substrate whereby the spacer material can be more easily etched selective to the carbon-containing core and gap-fill material to thereby reduce the amount of degradation and etching on the carbon-containing material.

Provided herein are methods and apparatuses for patterning a substrate using negative patterning schemes whereby the spacer material used for such patterning schemes have an etch selectivity relative to carbon-containing material of at least 6:1, such that the etch rate of spacer material is at least six times faster than that of the carbon-containing material. Disclosed embodiments also involve deposition of spacer material having a low density to ensure faster etch rate of the spacer material relative to the carbon-containing material. Methods involve depositing spacer material using a plasma enhanced atomic layer deposition (PEALD) methods.

Figure 3:
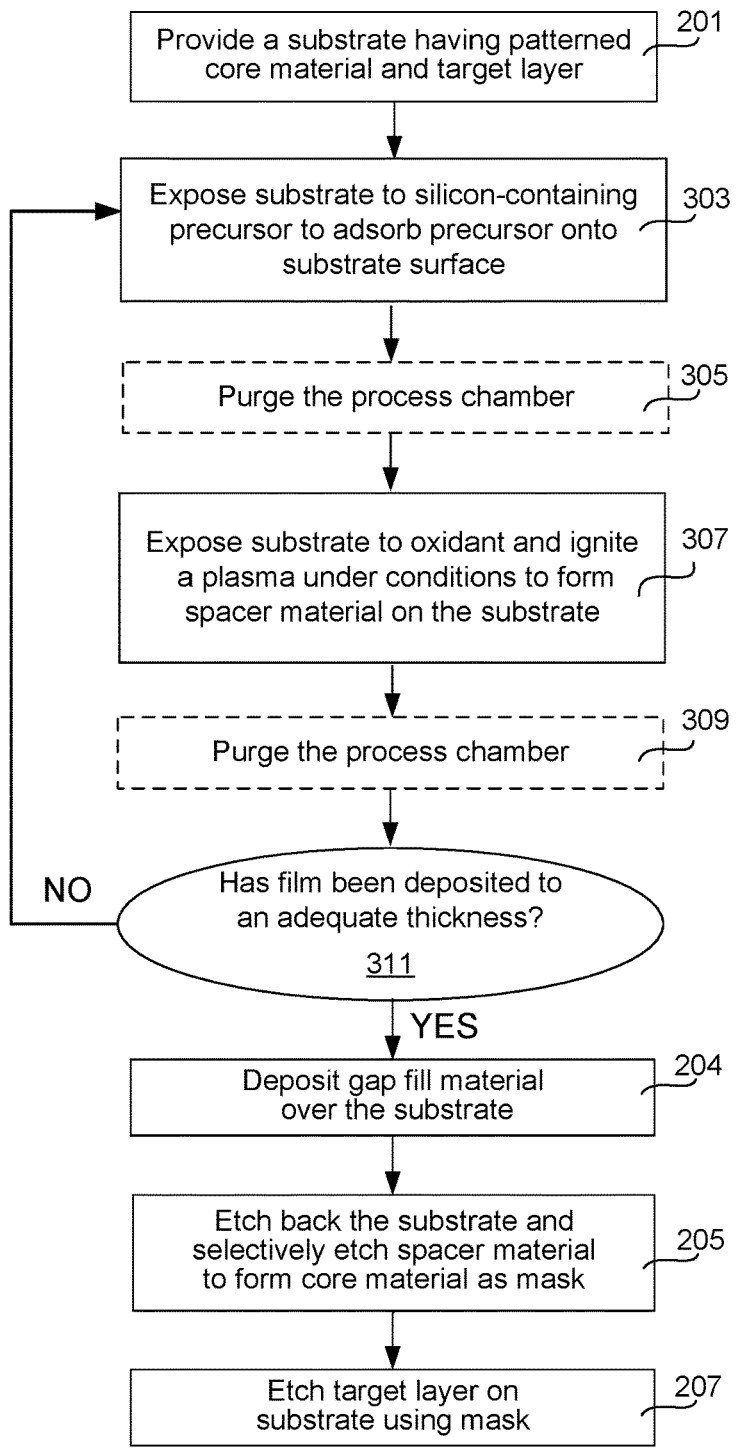

FIG. 3 provides a process flow diagram depicting operations that are performed in accordance with certain disclosed embodiments. Operations 201, 204, 205, and 207 are provided as operations described above with respect to FIG. 2 such that operations 303-311 may be performed to deposit spacer material conformally over a substrate in operation 203 above. It will be understood that operations performed in FIG. 3 may be performed in a patterning scheme such as shown in FIG. 2. It will be further understood that operations 201, 204, 205, and 207 may vary depending on the patterning scheme used. For example, a double patterning scheme and quad patterning scheme may have different and/or additional operations.

Referring to FIG. 3, in operation 201, a substrate having patterned core material over a target layer is provided. This operation may include providing a substrate such as described above with respect to operation 201 of FIG. 2.

Operations 303-311 of FIG. 3 may be performed at a temperature between about 50° C. and about 200° C., and at a pressure between about 1.0 Torr and about 9.0 Torr. Methods described herein may involve ALD. For example, in FIG. 3, operations 303-309 may constitute one cycle of ALD. Although operations described in FIG. 3 refer to formation of a silicon-containing spacer material, it will be understood that in some embodiments, a germanium-containing precursor used to deposit a germanium-containing spacer material may be used. For example, the spacer material may be germanium, or in some embodiments, a metal oxide, such as titanium oxide, tin oxide, zirconium oxide, or hafnium oxide.

Referring to FIG. 3, in operation 303, the substrate is exposed to a silicon-containing precursor to adsorb silicon-containing precursor onto the substrate surface. In various embodiments, the silicon-containing precursor may adsorb onto at least about 80% of the surface active sites. In some embodiments, the silicon-containing precursor may adsorb onto the substrate to fully saturate the surface of the substrate such that the silicon-containing precursor adsorbs onto the exposed surfaces of the core material and exposed regions of the target layer. The duration for exposing the substrate to the silicon-containing precursor may be between about 0.1 seconds and about 2 seconds.

Silicon-containing precursors suitable for use in accordance with disclosed embodiments include polysilanes $(H_3Si—(SiH_2)_n—SiH_3)$, where n≥0. Examples of silanes are silane $(SiH_4)$, disilane $(Si_2H_6)$, and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane $(SiH_2(NHC(CH_3)_3)_2$ (BTBAS), tert-butyl silylcarbamate, $SiH(CH_3)—(N(CH_3)_2)_2$, $SiHCl—(N(CH_3)_2)_2$, $(Si(CH_3)_2NH)_3$ and the like. A further example of an aminosilane is trisilylamine $(N(SiH_3))$.

In operation 305, a process chamber housing the substrate may be purged to remove precursors that are not adsorbed onto the substrate surface. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, operation 305 may include one or more evacuation subphases for evacuating the process chamber. Alternatively, it will be appreciated that operation 305 may be omitted in some embodiments. Operation 305 may have any suitable duration, such as between about 0.1 seconds and about 2 seconds.

In operation 307, the substrate is exposed to an oxidant and a plasma is ignited under conditions to convert the adsorbed precursors to spacer material having an etch rate at least six times as fast as the etch rate of the core material. Where silicon oxide spacer is being deposited, the silicon-containing precursor adsorbed onto the substrate surface reacts with the oxidizing plasma to form silicon oxide. Example oxidants include oxygen gas, water, carbon dioxide, nitrous oxide, and combinations thereof. Plasma energy is provided to activate the second reactant, such as an oxygen-containing gas, into ions and radicals and other activated species, which react with the adsorbed layer of the first precursor. For example, the plasma may directly or indirectly activate the oxygen-containing gas phase molecules to form oxygen radicals or ions.

During operation 307, any one or more of the following conditions may be modulated to deposit a low density silicon oxide film having an etch rate at least about 6 times as fast as the etch rate of the core material when exposed to a fluorocarbon etchant: (1) inert gas flow rate to oxidant flow rate to the chamber; (2) radio frequency (RF) plasma "ON" time; and (3) RF plasma power. The silicon oxide film may have refractive index between about 1.4 and about 1.5. In various embodiments, the silicon oxide film may have a dielectric constant of about 4 and about 6, such as about 5.

For modulation of inert gas flow rate to oxidant flow rate, it will be understood that during operation 307, an inert gas may be flowed as a carrier gas or may be flowed with the oxidant into the process chamber. The ratio of flow rate of inert gas to flow rate of oxidant may be between about 1:100 and about 1:1.5, or between about 1:12 and 1:4, to facilitate formation of a low density silicon oxide film. In various embodiments, the oxidant may be flowed at a flow rate between about 0.5 slm and 3 slm.

In various embodiments, the plasma ignited may be a single or dual radio frequency plasma. Single frequency plasmas are typically, though not necessarily, high frequency (HF)-only, with dual frequency plasmas typically including a low frequency (LF) component as well. In various embodiments, the plasma is an in-situ plasma, such that the plasma is formed directly above the substrate surface in the chamber. The in-situ plasma may be ignited at a power per substrate area between about 0.05 W/cm$^2$ and about 0.2 W/cm$^2$. For example, the power may be between about 50 W and about 250 W for each station over an area of a 12 inch wafer. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that an oxidant is ignited in a remote plasma generator upstream of the chamber, then delivered to the chamber where the substrate is housed.

RF plasma "ON" time may be modulated such that the duration for which the plasma is ignited during operation 307 may be changed. The RF plasma "ON" time may be less than about 300 milliseconds.

Operation 307 involves modulating any one or more of (1) inert gas flow rate to oxidant flow rate to the chamber; (2) radio frequency (RF) plasma "ON" time; and (3) RF plasma power. For modulating inert gas flow rate to oxidant flow rate to the chamber, the ratio of inert gas to oxidant may be between about 1:100 and about 1:1.5, or between about 1:12 and 1:4. For modulating RF plasma "ON" time, the RF plasma "ON" time may be less than about 300 milliseconds. For modulating RF plasma power, the plasma power density (W per substrate area) may be between about 0.2 W/cm$^2$ and about 2 W/cm$^2$. In various embodiments, operation 303 may involve introducing a silicon-containing precursor such as silane, disilane, BTBAS, and SAM24, and the oxidant used in operation 307 may be any of oxygen gas, water, carbon dioxide, nitrous oxide, and combinations thereof.

Referring to FIG. 3, in operation 309, the process chamber may be purged to remove any excess byproducts from the reaction between the spacer material precursor and the oxidant, and remove excess oxidant that did not react with the spacer material precursor on the substrate surface. The process conditions for operation 309 may be any of those described above with respect to operation 305. In some embodiments, the chamber is purged using an inert gas flowed at a flow rate between about 5 slm and about 30 slm.

In operation 311, it is determined whether the spacer film has been deposited to an adequate thickness. If not, operations 303-309 may be optionally repeated. If the spacer is deposited to an adequate thickness, operations 204, 205, and 207 may be performed as described above with respect to FIG. 2.

Figure 4A:
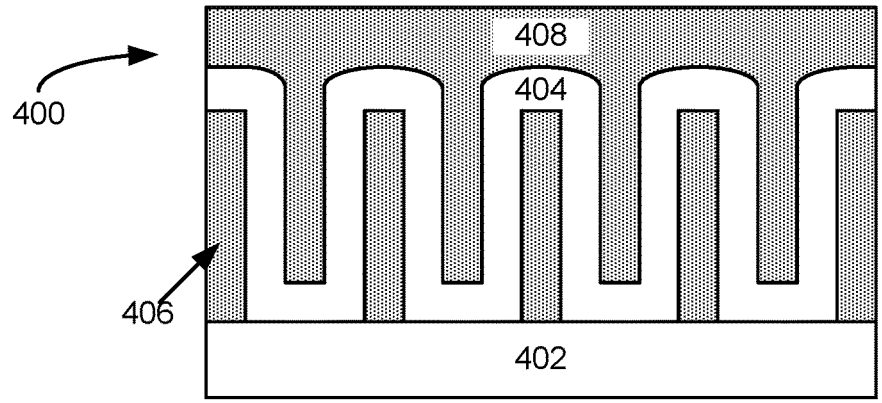
FIGS. 4A-4C are schematic illustrations of the substrate subject to a negative self-aligned double patterning scheme in accordance with certain disclosed embodiments.
Figure 4B:
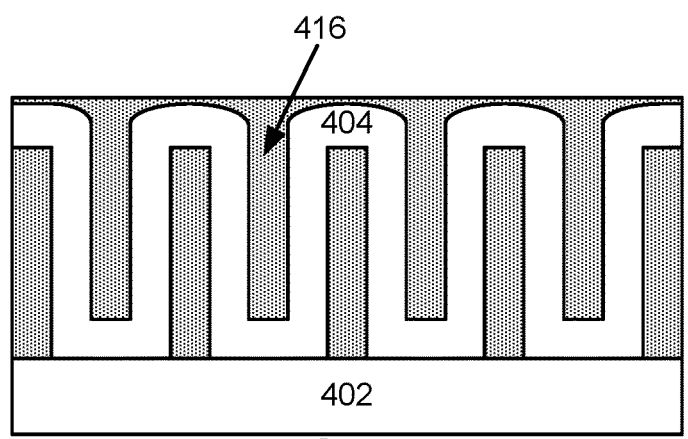
Figure 4C:
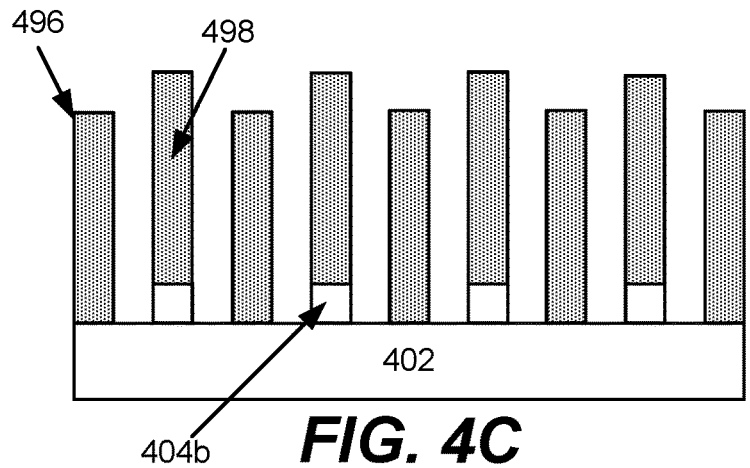

FIGS. 4A-4C show schematic illustrations of an example substrate 400 having a spacer material 404 deposited using certain disclosed embodiments used in a negative patterning application. In FIG. 4A, a gap fill carbon-containing layer 408 is deposited over spacer material 404 deposited using certain disclosed embodiments. Note that spacer material 404 is deposited conformally over core material 406 atop target layer 402. In FIG. 4B, the gap fill carbon-containing material 416 is etched back. In FIG. 4C, the spacer material 404b is selectively and directionally etched to leave etched core material 496 and etched gap fill carbon-containing material 498 on the substrate over target layer 402. Note there is some spacer material 404b left under gap fill carbon-containing material 498. The resulting mask has a good profile with little to no degradation of the height of the mask, which can thereby be used to etch the target layer 402 effectively.

Apparatus

Figure 5:
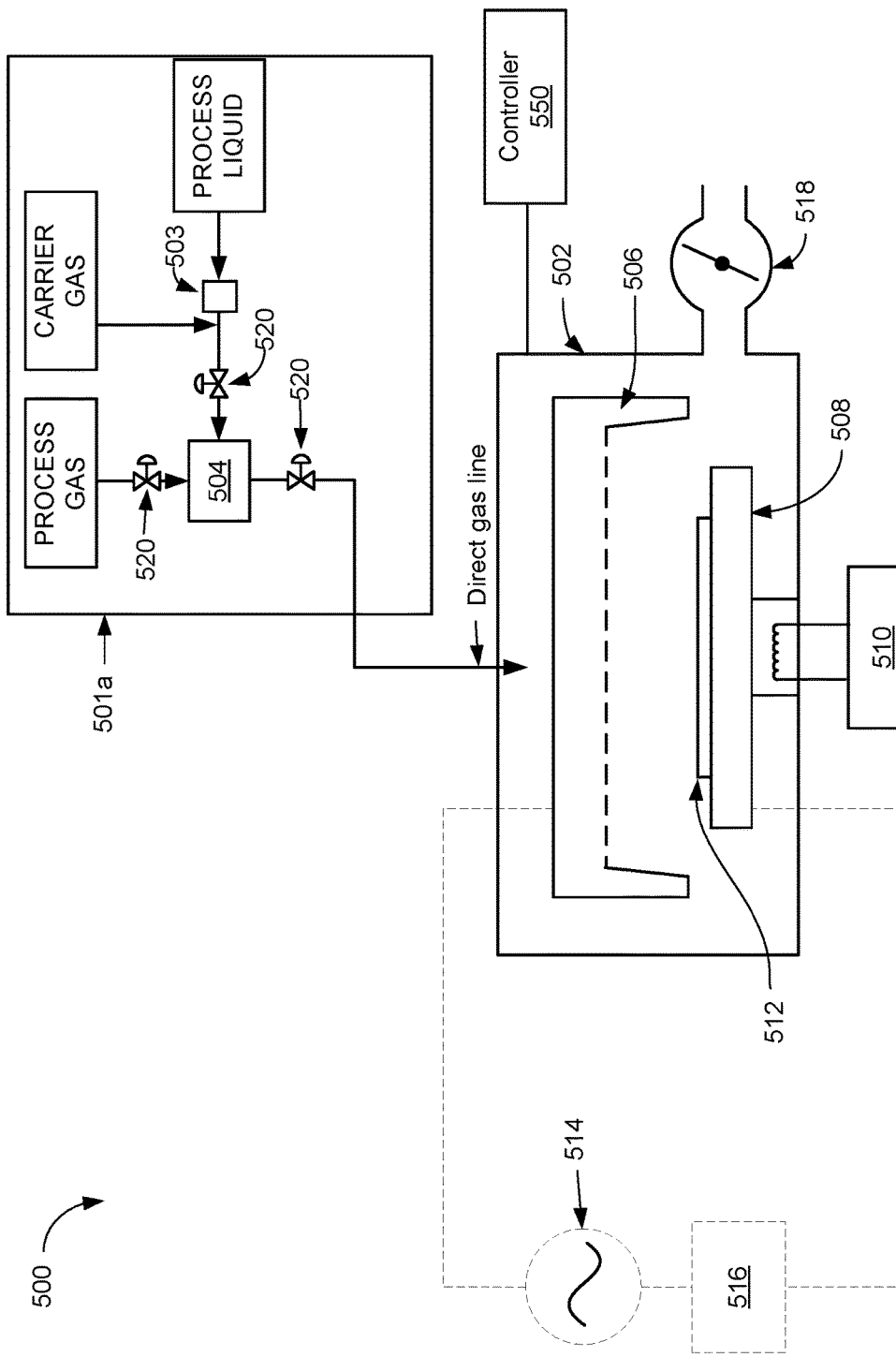
FIGS. 5 and 7 are schematic diagrams of example process chambers for performing certain disclosed embodiments.
Figure 6:
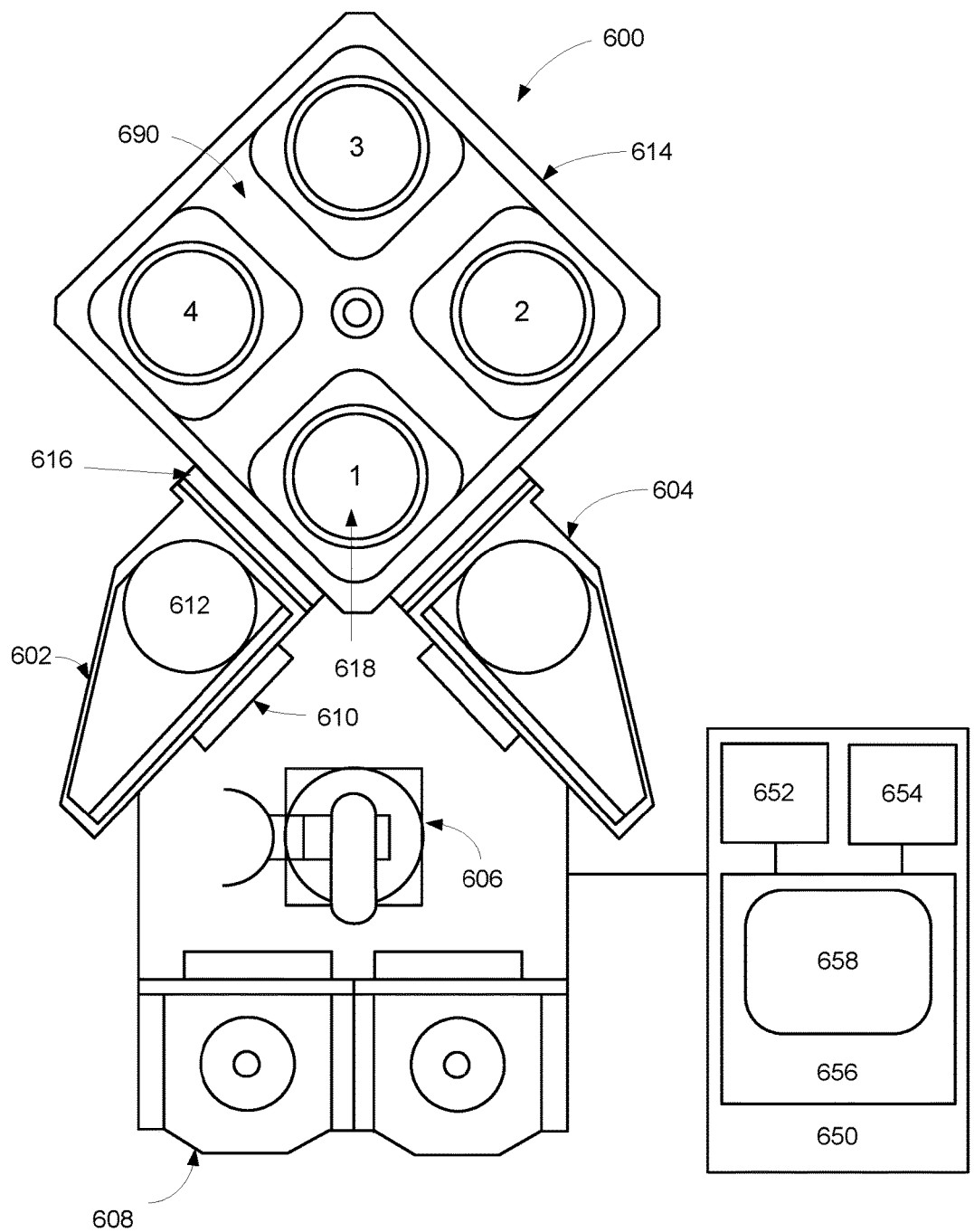
FIGS. 6 and 8 are schematic diagram of example process tools for performing certain disclosed embodiments.

FIG. 5 depicts a schematic illustration of an embodiment of an atomic layer deposition (ALD) process station 500 having a process chamber 502 for maintaining a low-pressure environment. A plurality of ALD process stations may be included in a common low pressure process tool environment. For example, FIG. 6 depicts an embodiment of a multi-station processing tool 600. In some embodiments, one or more hardware parameters of ALD process station 500, including those discussed in detail below, may be adjusted programmatically by one or more computer controllers 550.

ALD process station 500 fluidly communicates with reactant delivery system 501a for delivering process gases to a distribution showerhead 506. Reactant delivery system 501a includes a mixing vessel 504 for blending and/or conditioning process gases, such as a silicon-containing gas, or oxygen-containing gas, for delivery to showerhead 506. Reactant delivery system 501a may also modulate the inert gas to oxygen-containing gas ratio for delivering gases to the process station 500 to deposit a low density silicon oxide film. One or more mixing vessel inlet valves 520 may control introduction of process gases to mixing vessel 504. In various embodiments, deposition of a spacer material is performed in process station 500 and etching is also performed in the same process station 500. For example, in some embodiments, the ALD process station 500 may be used to deliver a deposition precursor gas to the process chamber 502, then deliver an oxidizing gas and ignite a plasma to form low density silicon oxide. In some embodiments, the etching operations such as to selectively etch spacer material to form a carbon-containing mask is performed in a process station separate from the ALD process station 500, such as in another station of the multi-station processing tool 600 as further described below with respect to FIG. 6.

As an example, the embodiment of FIG. 5 includes a vaporization point 503 for vaporizing liquid reactant to be supplied to the mixing vessel 504. In some embodiments, vaporization point 503 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, a liquid precursor or liquid reactant may be vaporized at a liquid injector (not shown). For example, a liquid injector may inject pulses of a liquid reactant into a carrier gas stream upstream of the mixing vessel 504. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) upstream of vaporization point 503 may be provided for controlling a mass flow of liquid for vaporization and delivery to process chamber 502. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 506 distributes process gases toward substrate 512. In the embodiment shown in FIG. 5, the substrate 512 is located beneath showerhead 506 and is shown resting on a pedestal 508. Showerhead 506 may have any suitable shape, and may have any suitable number and arrangement of ports for distributing process gases to substrate 512.

In some embodiments, pedestal 508 may be raised or lowered to expose substrate 512 to a volume between the substrate 512 and the showerhead 506. In some embodiments, pedestal 508 may be temperature controlled via heater 510. Pedestal 508 may be set to any suitable temperature, such as between about 25° C. and about 650° C. during operations for performing various disclosed embodiments. It will be appreciated that, in some embodiments, pedestal height may be adjusted programmatically by a suitable computer controller 550.

In another scenario, adjusting a height of pedestal 508 may allow a plasma density to be varied during plasma activation cycles performed in certain disclosed embodiments. At the conclusion of a process phase, pedestal 508 may be lowered during another substrate transfer phase to allow removal of substrate 512 from pedestal 508.

In some embodiments, a position of showerhead 506 may be adjusted relative to pedestal 508 to vary a volume between the substrate 512 and the showerhead 506. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers 550. The computer controller 550 may include any of the features described below with respect to controller 650 of FIG. 6.

In some embodiments where plasma may be used as discussed above, showerhead 506 and pedestal 508 electrically communicate with a radio frequency (RF) power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon-containing precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as oxygen, instructions for modulating the flow rate of a carrier or purge gas, instructions for igniting a plasma at low power, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

As described above, one or more process stations may be included in a multi-station processing tool. FIG. 6 shows a schematic view of an embodiment of a multi-station processing tool 600 with an inbound load lock 602 and an outbound load lock 604, either or both of which may include a remote plasma source (not shown). A robot 606, at atmospheric pressure, is configured to move wafers from a cassette loaded through a pod 608 into inbound load lock 602 via an atmospheric port 610. A wafer (not shown) is placed by the robot 606 on a pedestal 612 in the inbound load lock 602, the atmospheric port 610 is closed, and the load lock inbound 602 is pumped down. Where the inbound load lock 602 includes a remote plasma source, the wafer may be exposed to a remote plasma treatment in the inbound load lock 602 prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 614 may include one or more matched pairs of ALD and plasma-enhanced ALD process stations. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components used to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., silicon-containing gases, oxygen-containing gases, gases for performing a post-dose treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 650 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 650.

In some implementations, the system controller 650 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 650, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 650, in some implementations, may be a part of or coupled to a computer that is integrated with, coupled to the system, otherwise networked to the system, or a combination thereof. For example, the system controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 650 receives instructions in the form of data, which specify parameters for each of the processing steps to be performed during one or more operations. It should be understood that the parameters may be specific to the type of process to be performed and the type of tool that the system controller 650 is configured to interface with or control. Thus as described above, the system controller 650 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 650 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Etching operations described herein, such as for etching core material selective to the spacer material, may be performed in any suitable process chamber. In some embodiments, substrates may be etched in an inductively coupled plasma (ICP) reactor such as shown in FIG. 7.

Inductively coupled plasma (ICP) reactors which, in certain embodiments, may be suitable for etching operations and atomic layer deposition (ALD) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 7:
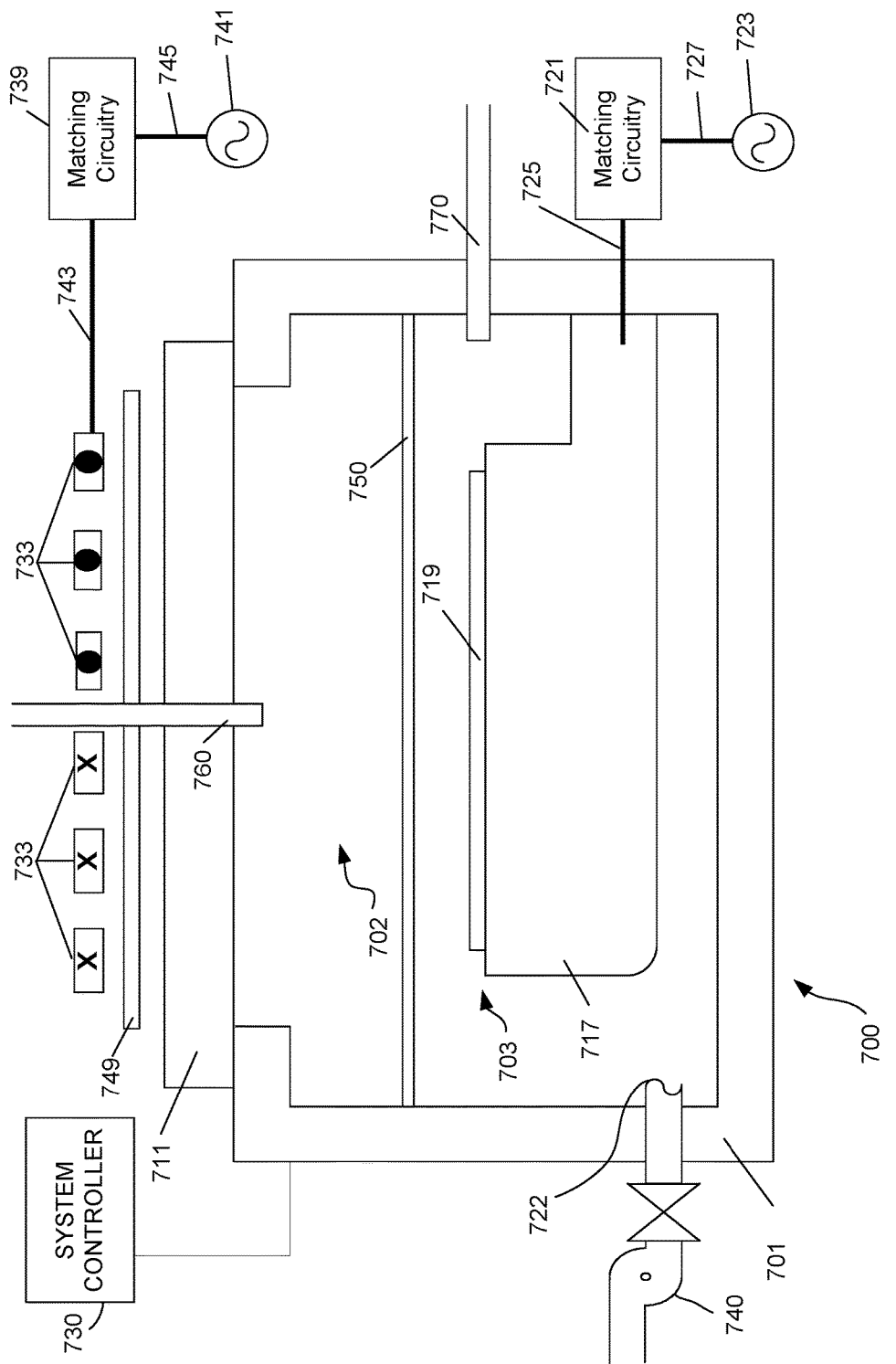

FIG. 7 schematically shows a cross-sectional view of an inductively coupled plasma integrated etching and deposition apparatus 700 appropriate for implementing certain embodiments herein, an example of which is a Kiyo™ reactor, produced by Lam Research Corp. of Fremont, Calif. The inductively coupled plasma apparatus 700 includes an overall process chamber structurally defined by chamber 701 walls and a window 711. The chamber 701 walls may be fabricated from stainless steel or aluminum. The window 711 may be fabricated from quartz or other dielectric material. An optional internal plasma grid 750 divides the overall processing chamber into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor wafer 719 upon which the etching and deposition processes are performed. The chuck 717 can be an electrostatic chuck for supporting the wafer 719 when present. In some embodiments, an edge ring (not shown) surrounds chuck 717, and has an upper surface that is approximately planar with a top surface of a wafer 719, when present over chuck 717. The chuck 717 also includes electrostatic electrodes for chucking and dechucking the wafer. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. In some embodiments, a coil is not used in disclosed embodiments. The coil 733 is fabricated from an electrically conductive material and includes at least one complete turn. The example of a coil 733 shown in FIG. 7 includes three turns. The cross-sections of coil 733 are shown with symbols, and coils having an "X" extend rotationally into the page, while coils having a "●" extend rotationally out of the page. Elements for plasma generation also include an RF power supply 741 configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield may prevent metal or other species from depositing on the dielectric window of the plasma chamber.

Process gases may be flowed into the processing chamber through one or more main gas flow inlets 760 positioned in the upper chamber and/or through one or more side gas flow inlets 770. Likewise, though not explicitly shown, similar gas flow inlets may be used to supply process gases to a capacitively coupled plasma processing chamber. A vacuum pump, e.g., a one or two stage mechanical dry pump and/or turbomolecular pump 740, may be used to draw process gases out of the process chamber 724 and to maintain a pressure within the process chamber 700. For example, the pump may be used to evacuate the chamber 701. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced more complex gas flow inlets, one or more showerheads, for example. The Faraday shield 749 and/or optional grid 750 may include internal channels and holes that allow delivery of process gases to the chamber. Either or both of Faraday shield 749 and optional grid 750 may serve as a showerhead for delivery of process gases. In some embodiments, a liquid vaporization and delivery system may be situated upstream of the chamber 701, such that once a liquid reactant is vaporized, the vaporized reactant is introduced into the chamber via a gas flow inlet 760 and/or 770.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 selectively etch features of and deposit layers on the wafer.

If the plasma grid is used such that there is both an upper sub-chamber 702 and a lower sub-chamber 703, the inductive current acts on the gas present in the upper sub-chamber 702 to generate an electron-ion plasma in the upper sub-chamber 702. The optional internal plasma grid 750 limits the amount of hot electrons in the lower sub-chamber 703. In some embodiments, the apparatus is designed and operated such that the plasma present in the lower sub-chamber 703 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 703 through port 722. The chuck 717 disclosed herein may operate at elevated temperatures ranging between about 10° C. and about 850° C. The temperature will depend on the process operation and specific recipe.

Chamber 701 may be coupled to facilities (not shown) when installed in a clean room or a fabrication facility. Facilities include plumbing that provide processing gases, vacuum, temperature control, and environmental particle control. These facilities are coupled to chamber 701, when installed in the target fabrication facility. Additionally, chamber 701 may be coupled to a transfer chamber that allows robotics to transfer semiconductor wafers into and out of chamber 701 using typical automation.

In some embodiments, a system controller 730 (which may include one or more physical or logical controllers) controls some or all of the operations of a processing chamber. The system controller 730 may include any one or more characteristic described above with respect to system controller 650.

Figure 8:
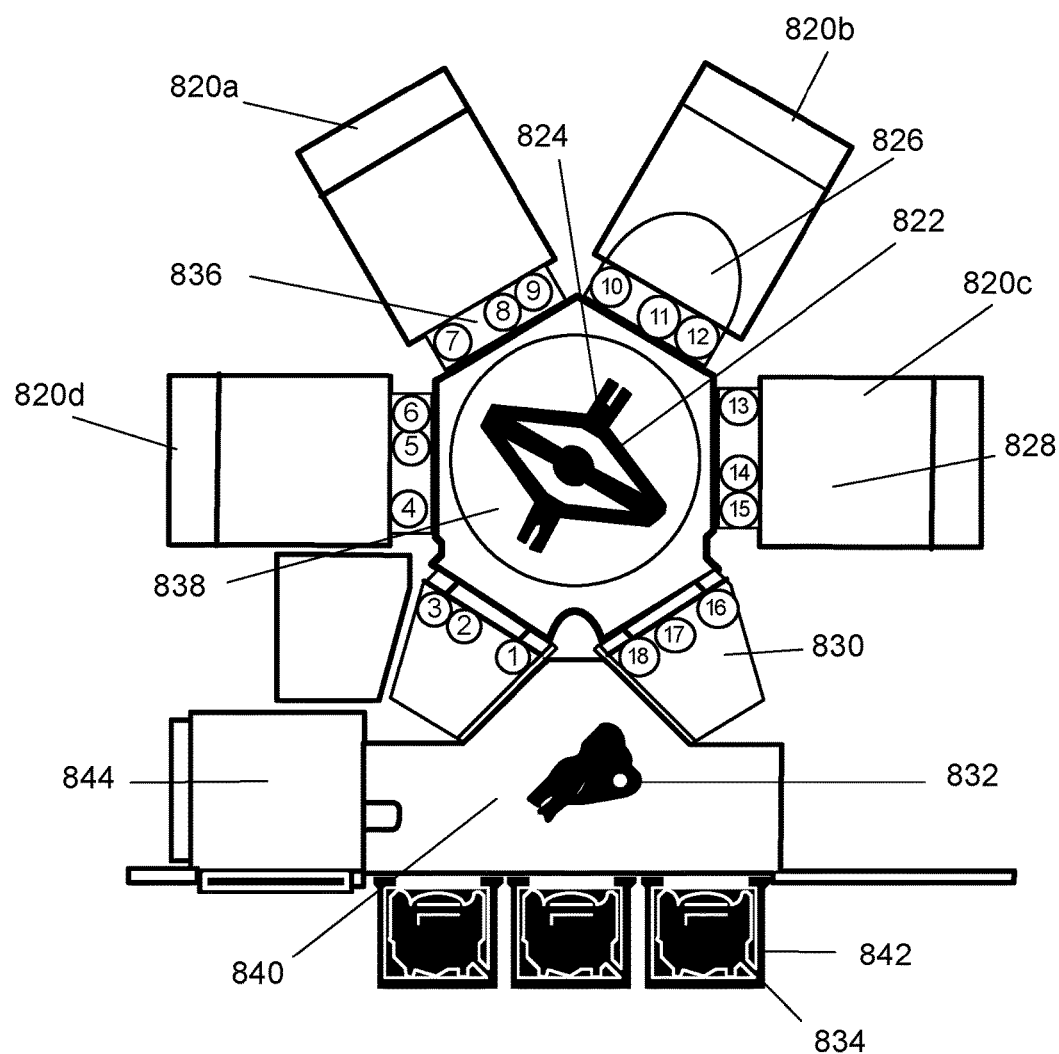

FIG. 8 depicts a semiconductor process cluster architecture with various modules that interface with a vacuum transfer module 838 (VTM). The arrangement of transfer modules to "transfer" wafers among multiple storage facilities and processing modules may be referred to as a "cluster tool architecture" system. Airlock 830, also known as a loadlock or transfer module, is shown in VTM 838 with four processing modules 820a-820d, which may be individual optimized to perform various fabrication processes. By way of example, processing modules 820a-820d may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 820a-820d) may be implemented as disclosed herein, i.e., for depositing conformal films, selectively depositing films by ALD, etching patterns, and other suitable functions in accordance with the disclosed embodiments. Airlock 830 and process module 820 may be referred to as "stations." Each station has a facet 836 that interfaces the station to VTM 838. Inside each facet, sensors 1-18 are used to detect the passing of wafer 826 when moved between respective stations.

Robot 822 transfers wafer 826 between stations. In one embodiment, robot 822 has one arm, and in another embodiment, robot 822 has two arms, where each arm has an end effector 824 to pick wafers such as wafer 826 for transport. Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process module 820 is one location for placing wafer 826. Aligner 844 in ATM 840 is used to align wafers.

In an exemplary processing method, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820a-820d. In order to achieve this wafer movement, the robot 822 uses end effectors 824 on each of its arms. Once the wafer 826 has been processed, it is moved by robot 822 from the process modules 820a-820d to an airlock module 830. From here, the wafer 826 may be moved by the front-end robot 832 to one of the FOUPs 834 or to the aligner 844.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 6 may be implemented with the tool in FIG. 8.

Experimental

Experimental 1

An experiment was conducted for etching three silicon oxide films. The first silicon oxide film was deposited by repeating the following in cycles: (1) dose of silicon-containing precursor; (2) purge; (3) dose of oxygen at a flow rate of 1.5 sccm and plasma ignited at a power of 900 W for a duration of 0.4 seconds; and (4) purge. Deposition was performed at 50° C. This substrate is designated as Substrate 1 in Table 1 below.

The second silicon oxide film was deposited by repeating the following in cycles: (1) dose of silicon-containing precursor; (2) purge; (3) dose of oxygen at a flow rate of 2 sccm and plasma ignited at a power of 900 W for a duration of 0.2 seconds; and (4) purge. Deposition was performed at 30° C. This substrate is designated as Substrate 2 in Table 1 below.

The third silicon oxide film was deposited by repeating the following in cycles: (1) dose of silicon-containing precursor; (2) purge; (3) dose of oxygen at a flow rate of 2 sccm and plasma ignited at a power of 300 W for a duration of 0.2 seconds; and (4) purge. Deposition was performed at 30° C. This substrate is designated as Substrate 3 in Table 1 below.

The three films were etched in a chamber having a chamber pressure of 30 mTorr, using pulsed dual frequency RF plasma having a LF frequency of 700 MHz, HF frequency of 1200 MHz, for 37 seconds while flowing $C_4F_6$ at a flow rate of 8 sccm, $O_2$ at a flow rate of 12 sccm, $C_4F_8$ at a flow rate of 6 sccm, and Ar at a flow rate of 500 sccm. The etch rates were measured and are shown in Table 1 below.

TABLE 1

Experiment 1 Results

| Substrate | Temperature (° C.) | RF Plasma Power (W) | Plasma Dose (sec) | Etch Rate Difference compared to Substrate 1 | Etch Rate (Å/hr) |
|---|---|---|---|---|---|
| Substrate 1 | 50 | 900 | 0.4 | 0% | 70900 |
| Substrate 2 | 30 | 900 | 0.2 | 7% | 75100 |
| Substrate 3 | 30 | 300 | 0.2 | 14% | 80900 |

These results suggest that reducing the RF on time, temperature, and RF power increases the etch rate, which thereby increases the etch selectivity of silicon oxide to carbon-containing core material.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of patterning a substrate using negative patterning, the method comprising:
    (a) depositing a spacer conformally over a core material, the spacer deposited by one or more atomic layer deposition cycles, each atomic layer deposition cycle comprising:
        (i) exposing the substrate to a deposition precursor, and
        (ii) exposing the substrate to an oxidant and igniting a plasma for a duration less than about 300 ms in each cycle; and
    (b) forming a mask for performing negative patterning on the substrate by selectively etching the spacer under conditions for etching the spacer at a rate at least six times faster than that of the core material.

2. The method of claim 1, wherein the core material comprises carbon.

3. The method of claim 2, wherein the core material is selected from the group consisting of spin on carbon, diamond-like carbon, and gapfill ashable hard mask.

4. The method of claim 1, wherein the spacer comprises a silicon-containing material.

5. The method of claim 4, wherein the spacer comprises silicon oxide.

6. The method of claim 1, further comprising etching the substrate through the mask during fabrication of a DRAM.

7. The method of claim 1, wherein the spacer has a refractive index between about 1.4 and about 1.5.

8. The method of claim 1, wherein the spacer is deposited to a thickness between about 10 nm and about 30 nm.

9. The method of claim 1, wherein selectively etching the spacer comprises exposing the substrate to a fluorocarbon etchant.

10. The method of claim 1, wherein the spacer is deposited at a temperature between about 50° C. and about 200° C.

11. The method of claim 1, wherein the spacer has a dielectric constant of between about 4 and 6.

12. A method of patterning a substrate using negative patterning, the method comprising:
    (a) depositing a spacer conformally over a core material, the spacer deposited by one or more atomic layer deposition cycles, each atomic layer deposition cycle comprising:
        (i) exposing the substrate to a deposition precursor, and
        (ii) exposing the substrate to an oxidant and igniting a plasma at a radio frequency power density of less than about 0.2 W/cm$^2$ of substrate active surface area; and
    (b) forming a mask for performing negative patterning on a substrate by selectively etching the spacer under conditions for etching the spacer at a rate at least six times faster than that of the core material.

13. The method of claim 12, wherein the core material comprises carbon.

14. The method of claim 12, wherein the spacer comprises a silicon-containing material.

15. The method of claim 12, wherein the spacer has a refractive index between about 1.4 and about 1.5.

16. The method of claim 12, wherein selectively etching the spacer comprises exposing the substrate to a fluorocarbon etchant.

17. The method of claim 12, wherein the spacer is deposited at a temperature between about 50° C. and about 200° C.

18. The method of claim 12, wherein the spacer has a dielectric constant of between about 4 and 6.

19. A method of patterning a substrate using negative patterning, the method comprising:
    (a) depositing a spacer conformally over a core material, the spacer deposited by one or more atomic layer deposition cycles, each atomic layer deposition cycle comprising:

(i) exposing the substrate to a deposition precursor,
(ii) exposing the substrate to gas mixture comprising an oxidant and argon, the gas mixture having a ratio of flow rate of argon to flow rate of oxidant of at least about 1:12, and
(iii) igniting a plasma in the gas mixture environment; and (b) forming a mask for performing negative patterning on a substrate by selectively etching the spacer under conditions for etching the spacer at a rate at least six times faster than that of the core material.

20. The method of claim 19, wherein the oxidant is flowed at a flow rate between about 0.5 slm and about 3 slm.

21. The method of claim 19, wherein the core material comprises carbon.

22. The method of claim 19, wherein the spacer comprises a silicon-containing material.

23. The method of claim 19, wherein the spacer has a refractive index between about 1.4 and about 1.5.

24. The method of claim 19, wherein selectively etching the spacer comprises exposing the substrate to a fluorocarbon etchant.

25. The method of claim 19, wherein the spacer is deposited at a temperature between about 50° C. and about 200° C.

26. The method of claim 19, wherein the spacer has a dielectric constant of between about 4 and 6.

* * * * *